(12) United States Patent
Lapanik et al.

(10) Patent No.: US 7,777,204 B2
(45) Date of Patent: Aug. 17, 2010

(54) SYSTEM AND METHOD OF ELECTRON BEAM WRITING

(75) Inventors: Dmitri Lapanik, Yokohama (JP); Shohei Matsushita, Yokohama (JP); Takashi Mitsuhashi, Fujisawa (JP); Zhigang Wu, Yokohama (JP)

(73) Assignee: Cadence Design Systems, Inc., San Jose, CA (US)

( * ) Notice: Subject to any disclaimer, the term of this patent is extended or adjusted under 35 U.S.C. 154(b) by 320 days.

(21) Appl. No.: 11/607,753

(22) Filed: Nov. 30, 2006

(65) Prior Publication Data

US 2007/0125967 A1     Jun. 7, 2007

Related U.S. Application Data

(60) Provisional application No. 60/741,696, filed on Dec. 1, 2005.

(51) Int. Cl.
G06F 17/50    (2006.01)
G03F 1/16     (2006.01)

(52) U.S. Cl. .......................... 250/492.22; 250/492.23; 430/5; 430/296; 716/21

(58) Field of Classification Search ............ 250/492.23, 250/492.22; 430/5, 296; 716/21; 355/53
See application file for complete search history.

(56) References Cited

U.S. PATENT DOCUMENTS

| | | | |
|---|---|---|---|
| 5,283,440 A * | 2/1994 | Sohda et al. ............. | 250/492.2 |
| 5,350,704 A | 9/1994 | Anderson et al. | |
| 5,424,173 A | 6/1995 | Wakabayashi et al. | |
| 6,560,768 B2 | 5/2003 | Inanami et al. | |
| 6,718,532 B2 | 4/2004 | Inanami et al. | |
| 6,782,524 B2 | 8/2004 | Rittman | |
| 2001/0028991 A1 | 10/2001 | Inanami et al. | |
| 2002/0010905 A1 | 1/2002 | Inanami et al. | |
| 2002/0010906 A1 | 1/2002 | Inanami et al. | |
| 2003/0003375 A1 | 1/2003 | Takita et al. | |
| 2008/0116399 A1 | 5/2008 | Fujimura et al. | |

FOREIGN PATENT DOCUMENTS

| | | |
|---|---|---|
| GB | 2363643 | 1/2002 |
| GB | 2363643 A | 1/2002 |
| WO | 2004008246 | 1/2004 |
| WO | 2004008246 A2 | 1/2004 |

OTHER PUBLICATIONS

International Search Report and Written Opinion for dated Mar. 26, 2006 for PCT/US2006/046125.
Mitsuhashi,T. U.S. Appl. No. 11/678,530, filed Feb. 2, 2007.
Fujimura, A. et al. U.S. Appl. No. 11/603,603, filed Nov. 21, 2006.

(Continued)

Primary Examiner—Jack I Berman
(74) Attorney, Agent, or Firm—Vista IP Law Group LLP.

(57) ABSTRACT

A system and method for improved electron beam writing that is capable of taking design intent, equipment capability and design requirements into consideration. The system and method determines an optimal writing pattern based, at least in part, on the received information.

25 Claims, 8 Drawing Sheets

(2A) IMPROVED CHARACTER APERTURE    (2B) ILLUMINATION REGION EXAMPLES

OTHER PUBLICATIONS

Yoshida, K., U.S. Appl. No. 11/603,441, filed Nov. 21, 2006.
Yoshida et al. U.S. Appl. No. 11/607,305, filed Dec. 1, 2006.
Fujimura et al. U.S. Appl. No. 11/677,973, filed Feb. 2, 2007.
Hara et al. U.S. Appl. No. 11/603,527, filed Nov. 11, 2006.
Hara et al. U.S. Appl. No. 11/603,526, filed Nov. 11, 2006.
Mitsuhashi,T. U.S. Appl. No. 11/226,253, filed Sep. 15, 2005.
Notice of Allowance and Fee(s) Due mailed on May 26, 2009 for U.S. Appl. No. 11/607,305.
Sugihara et al. "Technology mapping technique for throughput enhancement of character projection equipment", Proceedings SPI 6151 61510Z (2006), SPIE, Box 10, Bellingham, WA 98227.
Hattori, K. et al., "Electron Beam Direct Writing System EX-8D Employing Character Projection Exposure Method", Journal of Vacuum Science Technology, vol. B11(6) (1993), pp. 2346-2351, 1993, American Vacuum Society, New York, NY.
Hara, S. et al., "Character Projection EB Data Conversion System combined with Throughput Analyzer", Japanese Journal of Applied Physics, vol. 33 (1994), pp. 6935-6939, Japan Society of Applied Physics, Tokyo, Japan.
Nakasugi, T. et al. "Maskless Lithography Using Low Energy Electron Beam: Recent Results of Proof-of-Concept Tool", Journal of Vacuum Science Technology, vol. B20(6) (2000=2), pp. 2651-2656, American Vacuum Society, New York, NY.
Fujino, T. et al. "Character-Build Standard-Cell Layout Technique for High-Throughput Character-Projection EB Lithography", proceedings SPIE vol. 5853 (2005), pp. 161-167, SPIE, Bellingham, WA.
Kazama, T. et al., "Shot reduction technique for character projection lithography using combined cell stencil", Proceedings of SPIE vol. 5992, 59922V (2005), SPIE, Bellingham, WA.
Lapanik et al. U.S. Appl. No. 11/607,753 filed Nov. 11, 2006.
Office Action dated Dec. 31, 2008 for U.S. Appl. No. 11/607,753.

* cited by examiner

SYSTEM AND METHOD OF ELECTRON BEAM WRITING

CROSS-REFERENCE TO RELATED APPLICATIONS

This application claims the benefit of U.S. Provisional Application No. 60/741,696 filed on Dec. 1, 2005, which is hereby incorporated by reference in its entirety.

BACKGROUND

Electron Beam Writing (EBW) technology plays an important role in IC fabrication. It is used as a main tool for lithography mask writing. Recently its variation, the Electron Beam Direct Writing (EBDW) technology, has been considered as a prominent candidate for low volume IC production at 90 nm and below. These approaches have become solutions that are used to address mask cost issues for low volume LSI production.

The major weakness of this technology is its relatively low throughput. To overcome this barrier, the Variable Shape Beam (VSB) and the Cell Projection (CP, alternatively called Character Projection, or Block Projection) techniques have been introduced. The cell projection technique uses a stencil that allows writing of complicated repetitive patterns (CP cells) by one exposure shot, thus decreasing overall exposure time and increasing the writing system throughput. To utilize capabilities of the CP technique, a stencil design system has to be developed that is capable of proper repetitive pattern extraction, CP cell design and optimum CP cell placement on the stencil.

As shown in FIG. 1, this technique allows writing complicated patterns by one shot with an electron gun 100 that produces an electron beam 102, thus increasing throughput of the system. As noted, a central part of the technique is a stencil 110 that consists of a number of stencil patterns 112, alternatively called characters or CP cells. To increase the throughput and accuracy of a CP system, proper stencil pattern design is necessary. This technique produces an image 120 of a selected stencil pattern 114 on a substrate 122.

Although EBW technology provides many advantages, it is not perfect. Various effects negatively affect the process quality, decreasing yield and lowering overall throughput. Certain effects like Coulomb blur, proximity effect, electron beam (EB) distortions can be minimized by proper stencil design. Such processing may include, for example, more detailed fracturing and dose calculation, proper CP cell design and stencil layout. However, such calculations lead to the increase of the data volume and writing time. Also, making such calculations for the whole writing pattern is a time and resources consuming task.

As an enhancement of the CP writing technique, there exists the partial exposure method. In this method, a part of a CP cell can be illuminated, allowing writing not only whole CP cell but also its part by one shot. The advantage of this method is that one CP cell can be used for writing different patterns. Therefore, the same stencil can be used for writing more patterns by one shot.

The conventional partial CP exposure method has disadvantages. To expose a part of a CP cell, there must be a blank region around the cell that blocks the rest of the beam, as in most EB writing systems, the size of the beam illuminating the stencil is fixed by the first aperture. If another CP cell appears in the region that is supposed to be blank, a part of it will be exposed. Therefore, in the conventional partial CP exposure art, the cells are less densely packed than those could be without using partial CP exposure, because partial CP cells must have enough surrounding blank space.

Automation of the data preparation process for EBDW systems is a problem that has not been satisfactory solved yet. To achieve good throughput, repetitive design patterns must be selected and processed, then placed as CP cells on the stencil. Simultaneously, quality issues must be properly taken into account to maintain acceptable yield.

In current systems, the above mentioned problems are partially solved by introducing specific design flows and data processing algorithms for each specific design. The development of a layout specific stencil design system significantly increases the overall development time, therefore making the technology less advantageous.

There are also problems related to feature miniaturization in semiconductor devices. With the feature size decrease, writing accuracy becomes more and more important. But required accuracy is not uniform for all parts of a design. Some parts require tighter tolerances, some parts require less accuracy. The required accuracy depends on the feature's design intent. Current EBDW systems do not have capabilities for design intent aware operation.

Geometric structure of a CP cell and its position on the stencil strongly affect writing quality. To achieve required quality and simultaneously maximize the usage of stencil area, careful CP cell extraction and stencil layout optimization are needed that take the design intent information into account. Current data preparation systems do not support this functionality.

SUMMARY

The invention provides an improved approach by using design intent information during the data preparation process To make an optimized stencil design, to automate the data preparation, and to maintain the moderate complexity of the system, design intent information can be introduced during the data preparation process. The design intent information is particularly used in the stencil design phase, by taking more care to more critical part of the layout and locally balancing between accuracy and speed. To achieve this, some embodiments of the invention use design intent information in addition to the original design data. The design intent information may be, for example, in the form of numbers representing criticality of portions of the layout. When design intent is known, different processing rules can be associated with different intent categories. This additional processing information is also supplied to the data preparation system. For example, portion of the layout having higher criticality level can be processed more accurately than less critical parts. This allows designing more optimal stencil. Therefore, system accuracy and throughput are balanced more optimally.

The present invention provides an approach which avoids the problems with conventional approaches described in the background section. In particular, it is noted that a conventional stencil may already have cells with large blank adjacent regions. Those cells are the cells that are surrounded by the blank region being used for VSB exposure. However, the conventional method that uses the blank region consumes expensive stencil area. By this invention the periphery of the stencil (indicated as space between apertures in FIG. 10) is used for the blank region and saves waste of the stencil area. As beam distortions are higher on the periphery, the periphery cells can be used as partial CP cells for non-critical parts of the layout, while those cells that are surrounded by the blank area in the center of the stencil (this blank area is used for VSB writing) can be used as partial CP cells for critical parts of the layout.

In one embodiment, a method of electron beam writing includes receiving and combining stencil design data, design intent data and equipment capability data. An optimal electron beam writing pattern is determined based, at least in part, on the combined stencil data, design intent data and equipment capability data. An electron beam is directed in accordance with the optimal electron beam writing pattern.

In another embodiment, a method for electron beam writing includes accessing input data or information, statistically analyzing a cell layout pattern by calculating a number of repetitions of at least one cell of the cell layout pattern, and building cell projection candidates by analyzing statistical information of the repetitive portions of the cell layout pattern. The method includes placing the cell projection candidates on a stencil, estimating throughput of the cell projection candidates, and generating a stencil table.

In one aspect, accessing input data or information includes accessing at least one of design intent data, stencil data and equipment capability data, and/or accessing the input data or information includes at least one of assigning criticality levels to various portions of the design and defining geometric tolerances to classes of geometric shapes. Statistically analyzing a cell layout pattern includes determining the number of electron beam shots required to write the cell layout pattern. Building cell projection candidates includes conforming repetitive portions of the cell layout pattern to one or more stencil design rules. The one or more stencil design rules include at least one of maximal size of cell, absence of forbidden patterns including donut shapes and cantilevers, shape density and shape size constraints.

In another aspect, conforming repetitive portions of the cell layout pattern to one or more stencil design rules includes modifying the cell layout pattern to conform to the one or more stencil rules. Estimating throughput of the cell projection candidates includes comparing the calculated estimate against one or more corresponding targets. Estimating throughput of the cell projection candidates includes determining whether one or more predefined rules or conditions are satisfied. Generating the stencil table includes taping out the stencil data.

In still another embodiment, a stencil design system for electron beam writing includes at least one database for storing design intent data and stencil design rules, an electron beam writer, and a processor for receiving design intent data and stencil design rules from the at least one database and for generating a cell table for the electron beam writer.

These and other objects and advantages of the present teachings will become more fully apparent from the following description taken in conjunction with the accompanying drawings.

DETAILED DESCRIPTION

Reference will now be made to the drawings wherein like numerals refer to like parts throughout.

Some embodiments of the invention provides an improved approach by using design intent information during the data preparation process. This provides many advantages, including an optimized stencil design, permits automated data preparation, and allows the method and system to maintain the moderate complexity of the system. In one embodiment, the system can use a special processing rule set that allows processing of different design categories, as defined by their design intent, in a different manner. This approach is universal and allows balancing of the throughput and quality in an optimal way. One goal of the invention is to provide a formal way for the data processing that is capable of addressing the throughput and quality issues in an optimized way.

Figure 1:
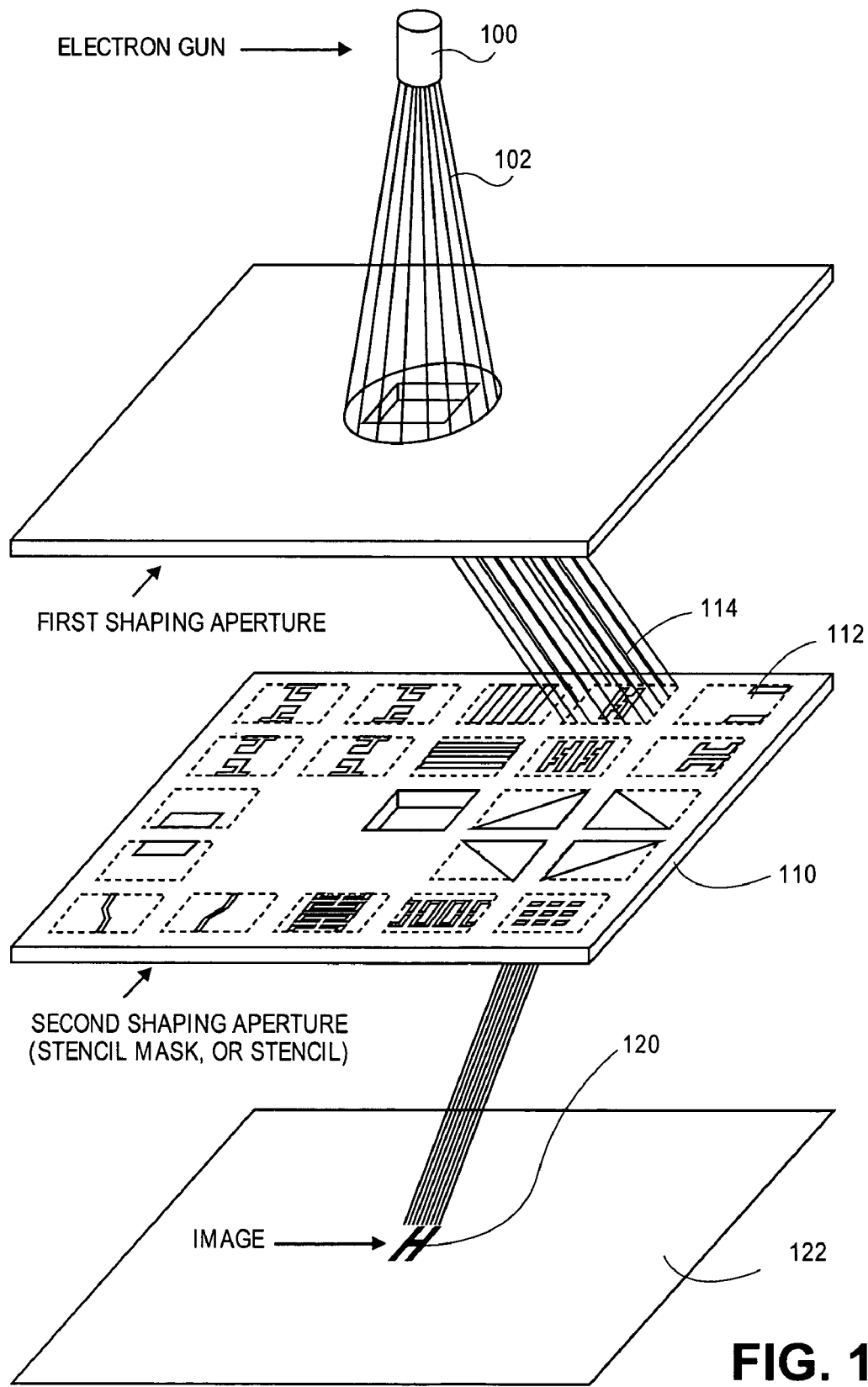
FIG. 1 illustrates an example electron beam writing technique.
Figure 2:
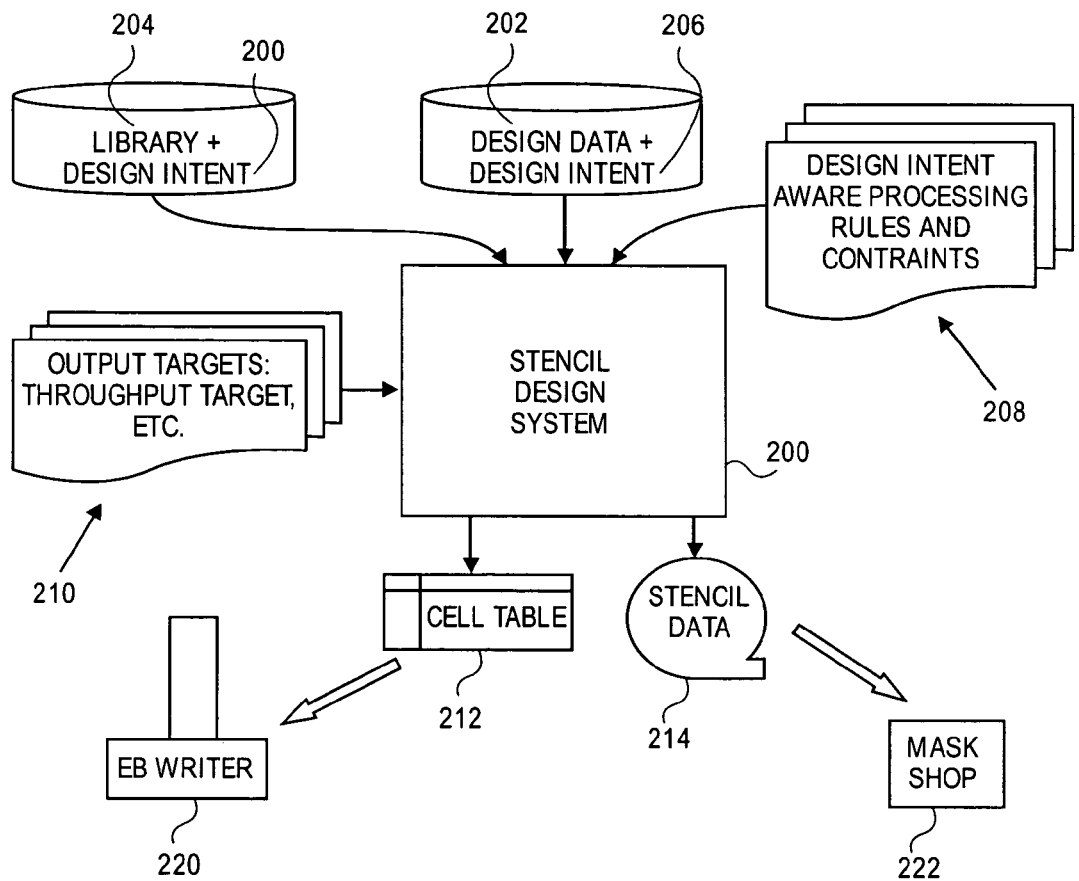
FIG. 2 depicts and embodiment of a system for electron beam writing.

FIG. 2 illustrates the structure of the stencil design system 200 according to an embodiment of the invention. The initial inputs for the system 200 are a design file 202, design library 204, design intent 206 that is generally provided for both the design and the library, design intent aware processing rules and constraints (like stencil design rules) 208, and output targets 210. In one aspect, an output of the system 200 is a cell table 212 comprising, for example, information on CP cells relevant to the writing process, layout file in a format readable by the writing machine, and a stencil layout file 214.

In general, the design data 202 can be represented in any industrial standard format like GDSII, Open Access, OASIS, or and other known and/or convenient format. The layout that is a part of the design can be described in terms of geometric shapes (polygons, paths, etc) and/or any other convenient terms.

The design intent information 206 is used during the data preparation to categorize layout elements or groups of elements with respect to various parameters like timing, geometric tolerances, yield and/or any other convenient data.

Some data representation standards may not have capabilities to include such information in .the data file. In this case, the Design Intent information can be supplied in the form of a file, or a script, and/or any other convenient manner. The Design Intent can also be included in the design if the standard input supports necessary syntax.

The design library 204 can include groups of geometric elements that are parts of the layout. In many cases, such groups are related to standard cells. However, in alternate embodiments, other forms are also possible. A memory module and an arithmetic module are examples of different uses of a library. A module compiler uses such groups as components of the target module. In the conventional art, the design intent information is not provided for elements of a design library. However, having design intent information for library elements can be important for optimal stencil design.

The processing rules 208 define what kind of data processing can be done for each design intent category. For example, fine border fracturing can be used for shapes with critical geometry, while faster and coarse fracturing can be done for non-critical shapes. As another example, in some embodiments the separation of critical shapes when possible can be avoided, because it can lead to critical dimension violations due to imperfect stitching.

The stencil design rules, an example of constraints 208, describe currently available stencil manufacturing technologies. Other constraints such as precision requirements can also be imposed and included as a part of the system's input. To achieve optimal balance between quality and speed, the constraints in general can be different for different design intent categories. For example, loose constraints can be set for less critical design constituents, tight constraints can be assigned to more critical ones.

In some embodiments, the cell table 212 may comprise information that is used by writing system 220 during the writing process. Detailed information on stencil design, such as positions of CP cells on the stencil, geometric information of each CP cell, and other relevant information, can be contained in the table 212.

The output targets 210 define the structure of desired output, e.g., throughput requirements etc.

Stencil layout data 214 can describe the geometry of the stencil. In many cases, stencil layout 14 can be provided as a file in a standard format such as GDSII. This file can be transferred to the mask shop 222 and used for stencil fabrication. In one aspect, the fabricated stencil can be used by EBW machine 220.

In some embodiments, the data preparation and stencil design system can make use of the design intent information to optimally balance the throughput and quality.

One target of a stencil design system according to some embodiments is to design an optimal stencil for a writing system based on a given input data. This provides maximization of throughput of the system and simultaneously maintaining required writing quality.

Figure 3:
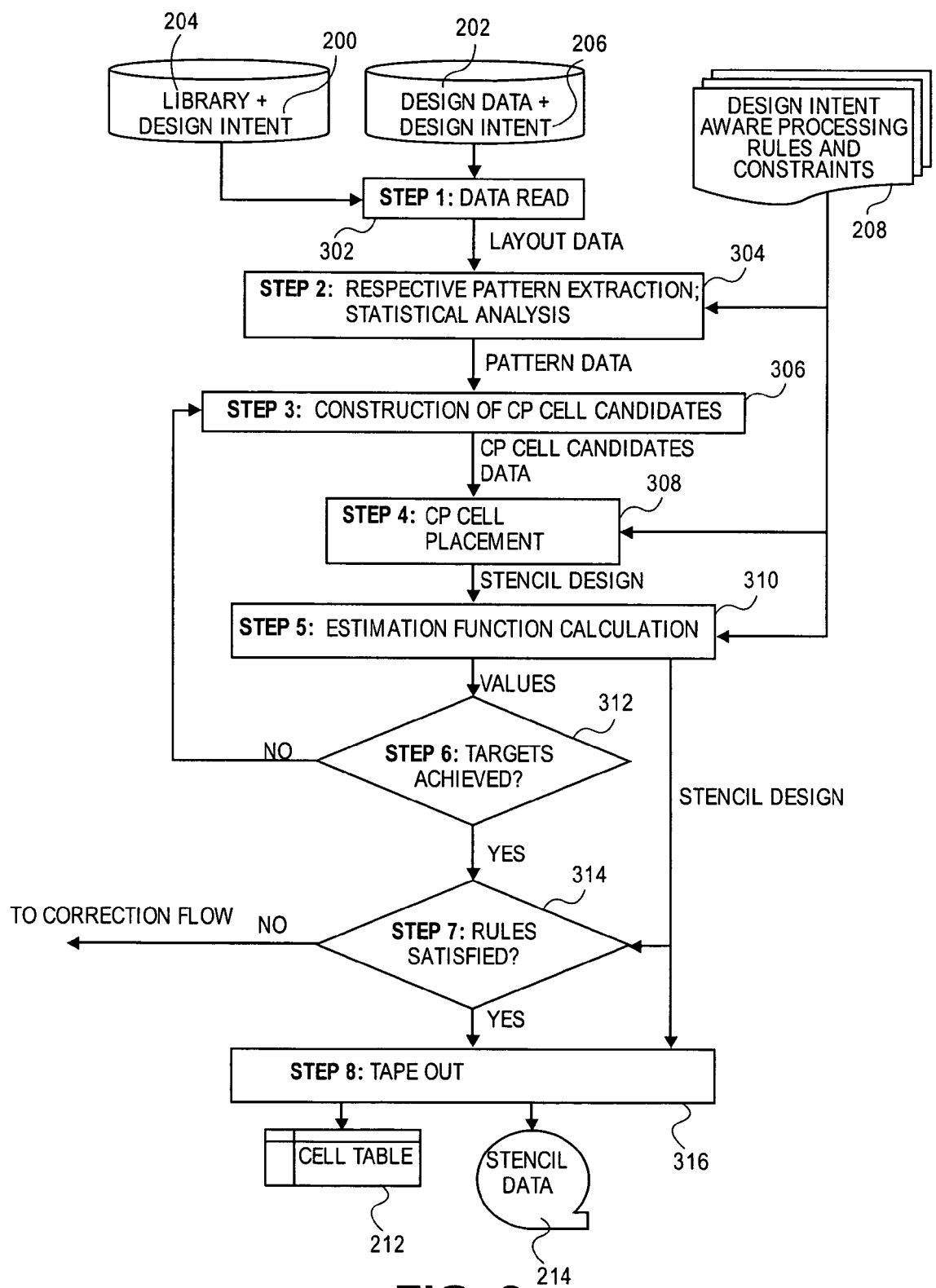
FIG. 3 depicts an embodiment of a method for electron beam writing.

FIG. 3 illustrates more details of the operation of the stencil design system 200 according to an embodiment of the invention. In one aspect, each of the steps in FIG. 3 are described in greater detail herein below.

At step 1 (302), input data is accessed. In one aspect, the design intent information is either integrated with the design data, or read from a separate file, or extracted by running a script with suitable script processing software.

The design intent information can be represented in various forms. Examples include, but are not limited to, assigning various criticality levels to various portions of the design, or defining specific geometric tolerances to certain class of geometric shapes.

At step 2 (304), statistical analysis of the layout is performed. In the case where the layout has the hierarchical "cell-instance" structure, the number of repetitions of each cell that constitutes layout is calculated. In the case where the layout data is flat, repetitive pattern extraction (automatic or manual) is performed first, and the repetition number calculation is made for the extracted patterns. It is also possible to build a new hierarchical structure that better represents repeatability of layout patterns. Also, the number of EB shots required to write the layout, as well as the number of shots for each cell (or extracted pattern) is estimated.

Patterns that have equal geometry but different design intent may be treated as different during this step. By doing that, more accurate statistics can be extracted, as in general design elements with different intent should be processed in different manner.

At step 3 (306), statistical information about the repetitive parts of the layout collected during step 2 (304) is used for building CP cell candidates. Since extracted repetitive patterns will be processed for placing on stencil, these will be configured to obey stencil design rules. In one aspect, the rules include, but are not limited to, maximal size of a cell, absence of forbidden patterns, such as, for example, doughnut shapes, cantilevers, etc., shape density and shape size constraints. To fulfill these constraints, pattern modification is often used.

Pattern modification may be performed at step 3 (306). A CP cell candidate is checked against the design rules. If a rule is violated, the rule specific action is performed. The goal of this step is not only to satisfy stencil design rules, but also to design a CP cell that will be written with required quality.

During step 3 (306), CP cells candidates are built. Simultaneously, in one aspect, design intent of various features is processed in pertinent manner; therefore additional requirement such as quality can be taken into account.

Illustrated examples of specific methods to achieve the goal of step 3 (306) will be described in more detail further below in this document.

In step 4 (308), extracted CP cells are placed on a stencil. In many cases, the number of CP cell candidates exceeds the number of CP cells that can be placed on a stencil. The present method uses design intent information during the CP cell placement phase to build an optimal stencil. Illustrated examples of specific methods to achieve the goal of step 4 (308) will be described in more detail further below in this document.

At step 5 (310), the estimation function is calculated. Throughput is one of the most important parameters to estimate, but other parameters can be taken into account by the corresponding choice of the estimation function. Also, multiple functions can be calculated to enhance the estimation.

Due to limitations of the technology and to additional constraints that may be imposed, in general it is difficult to write a whole layout by the CP method only. In a rule, there remains a part of the layout that has to be written by the VSB method. To estimate the throughput based on CP cells geometry extracted during step 4 (308), preliminary shape fracturing of the remaining part is performed.

Although optimized fracturing can be done after CP cell extraction is finalized, accurate fracturing estimation is needed for good shot number and throughput estimation. The estimation step uses design intent information to obtain an accurate shot number estimate.

An example of a specific method to achieve the goal of step 5 (310) will be described in greater detail herein below.

In step 6 (312), the values calculated in step 5 (310) are checked against corresponding targets. The main target for a CP system is throughput, but other targets also can be taken into account. If the targets are achieved, the system proceeds to the next step. If not, the system returns to the candidates extraction step.

During step 7 (314), the stencil data is checked to determine whether the predefined rules and conditions are satisfied. If not all the rules and conditions are satisfied, then the system proceeds to the correction flow. If the rules and conditions are satisfied, the system proceeds to step 8 (316). In one embodiment, during step 8 (316), the Cell Table is prepared and the stencil data is taped out.

There exist design specific algorithms that optimize quality during the extraction process. For example, there are algorithms for extracting CP cells from memory cells that optimize quality as well using specific memory cell structures and therefore not applicable if a cell candidate does not have such structure. In contrast, the present approach does not require such specific knowledge about the design. Instead, it uses abstract design categories that can be attached to virtually any design during the development phase. It also uses processing rules that are design intent specific (not layout specific as in conventional art). Therefore, same rules can be used without modifications for same intent categories, eliminating the need for the re-development of such rules for every specific layout.

Illustrative Examples for Step 3

A method of achieving the goal of step 3 (306) according to some embodiments will be described and illustrated by considering the following examples.

Example 1

Consider if the size of a CP cell candidate exceeds the maximum allowed size. In this case, cell separation may be required. In one approach, the separation is done straightforwardly by merely cutting the pattern. In some approaches, a pattern specific algorithm is then applied to modify the cut patterns to avoid quality problems that are likely to arise when using the straightforward approach. Using such pattern specific algorithms leads to a highly design specific system that has to be modified if one is going to use it for another design. In contrast to these schemes, an embodiment of the present approach uses design intent specific algorithms, instead of an design specific approach, to extract CP cells from a given candidate.

Figure 4:
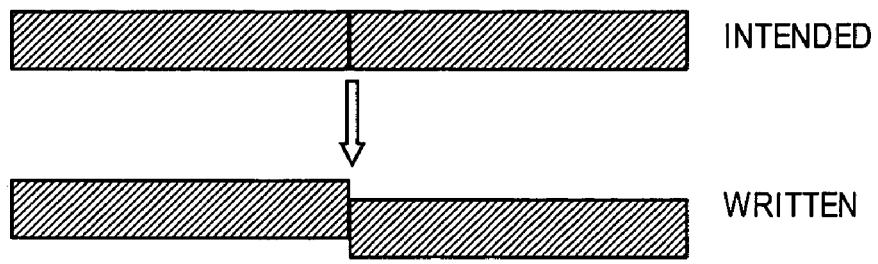
FIGS. 4-11 provide illustrative examples of approaches to implements steps in the flowchart of FIG. 3.

The main issue is that the cutting step can lead to separating critical shapes. When a shape is separated, it is written in two or more EB shots. Errors during the image stitching and other process imperfections, as well as effects due to processing like difference in exposure doses for the parts of the shape, can lead to image distortions, as illustrated in FIG. 4. Such distortions, in turn, if occurred in certain parts of the design, can lead to a failed product. Therefore, it is important to process such shapes in accordance to that specific role.

To such parts of the design, a corresponding design intent category may be attached beforehand. For each part of the candidate, the system selects and applies processing rules from the processing rules set (that is also designed beforehand and supplied to the system as an input) relevant to this intent category. For example, the processing rules are built in such way that the cutting line avoids certain category of shapes.

If it is impossible to draw such a line, it usually means that these shapes cannot be placed in a CP cell and will be written by VSB. The fracturing rules for VSB writing also use the shape's design intent to perform pertinent operations. For example, if the shape's intent assumes tight geometric tolerances, the shape's boundary must be fractured separately and dose calculations must be performed accordingly to minimize proximity and Coulomb effects.

Example 2

Consider if the extracted candidate contains a doughnut pattern. Most existing stencil manufacturing technologies do not allow such patterns, as no mechanical support can be provided for the inner part of the shape. Therefore, such shapes must be separated in two shapes or more.

Figure 5:
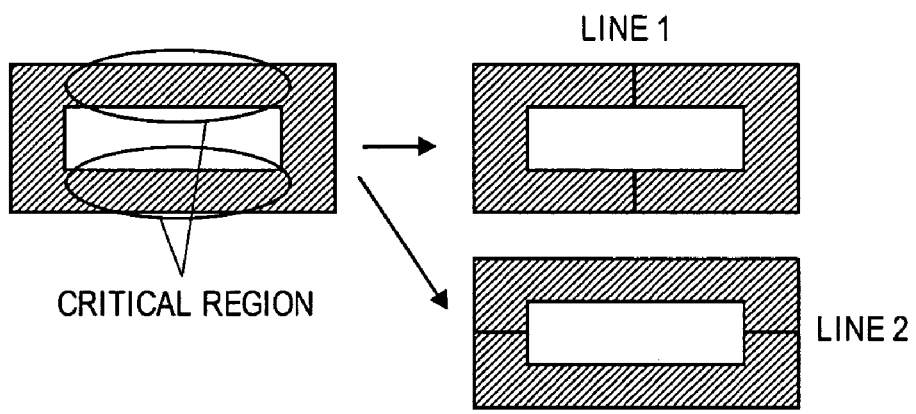

An example of such pattern is given in FIG. 5. The quality issues arise when the shape contains critical regions, as illustrated in the example. If the shape cut by line 1, the critical parts are cut. This can potentially lead to the same quality issues as described in Example 1. However, such situation can be avoided applying the previously described strategy. Namely, if the design intents of some parts of the shape are different, different intent categories are attached, and the parts are processed according to these categories. If however the design intent of the whole shape is same and the corresponding category does not allow shape separation, the whole shape must be written by VSB method. In the latter case, fracturing rules pertinent to the intent category apply.

Example 3

Figure 6:
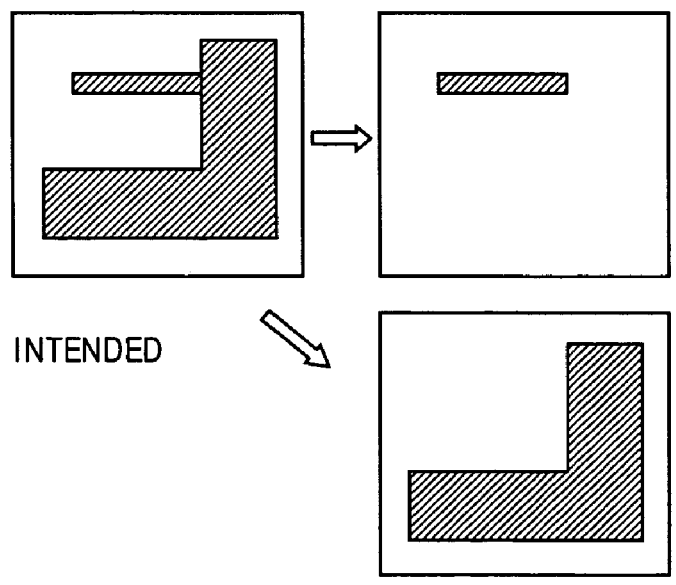

In this example, it is assumed that during EB writing process, shapes with different geometries are subject to different distortions. For example, Coulomb effect is more severe for wide, thick shapes, while small, thin shapes are less affected. If a critical shape contains both thin and thick parts, as illustrated in FIG. 6, it is very difficult or even impossible to adjust writing parameters in the case where the whole shape requires high dimension uniformity. In such case, the shape can be either split in two (as illustrated in FIG. 6) if its intent category allows, or written by VSB method. In the latter case, fracturing rules pertinent to the shape's intent category apply.

Example 4

Figure 7:
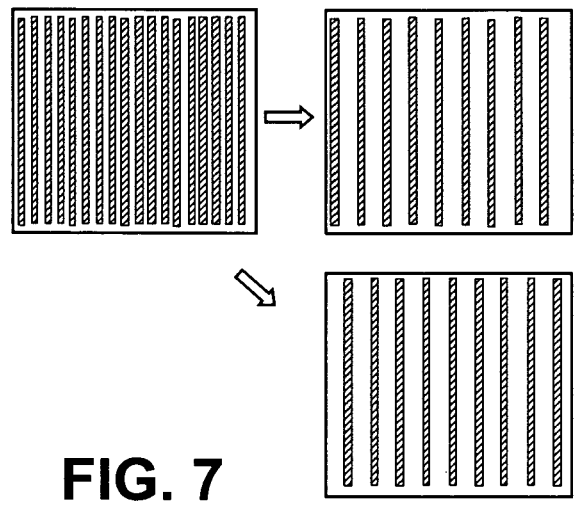

If a CP cell candidate contains a dense line and space pattern as illustrated in FIG. 7, its image can be significantly distorted because of the Coulomb effect, as current density in this case is relatively high. If the pattern's design intent dictates high writing accuracy, it is better to separate the pattern into two (as shown in FIG. 7) or even more patterns to minimize the distortions.

Example 5

It is possible to prevent certain shapes from being placed in a CP cell by putting such shapes in a pertinent intent category and designing the corresponding processing rules. Using the same method, one can force certain shapes to be placed in a CP cell.

Example 6

Figure 8:
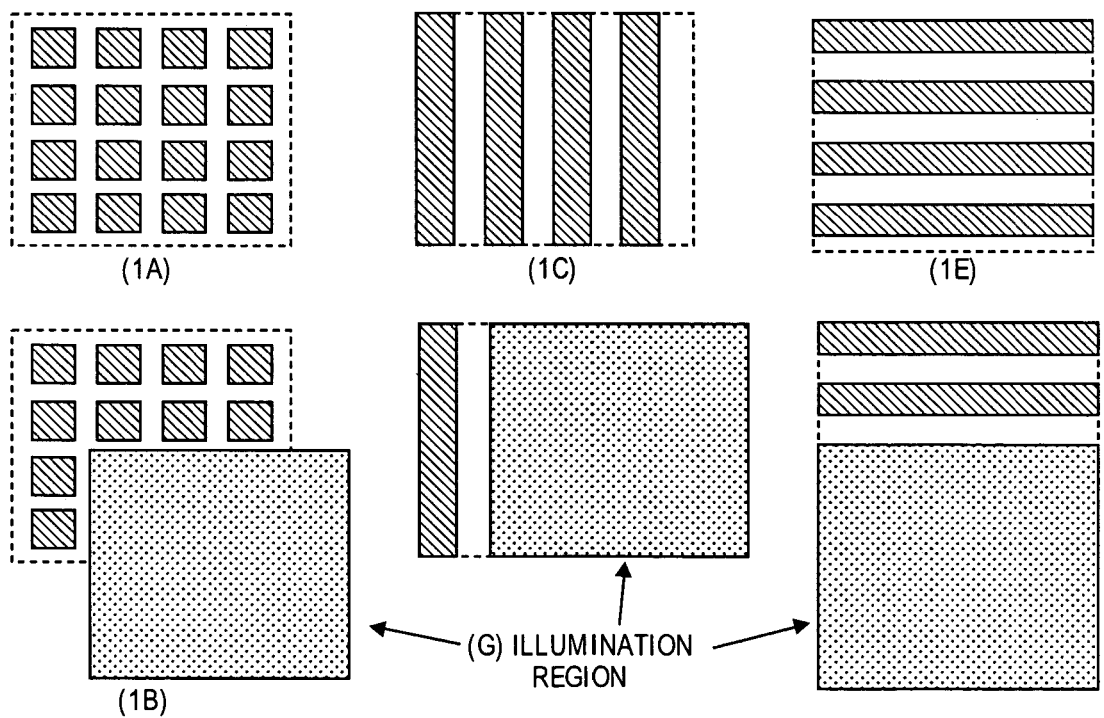

Partial exposure of CP cells is a prominent extension of the technology. It allows writing of more patterns in one shot than the number of CP cells placed on a stencil mask. This method can be effectively used, for example, for via layers. In via layers, via arrays of various size often occur. In many cases, there are arrays with different size but equal pitch between elements. For that case, an array having maximum size allowable by stencil design rules can be use as a generic one-shot pattern. All arrays having equal or smaller dimensions, equal element size and equal pitch between elements can be written by one partial exposure of that generic element. Therefore, the number of CP cells required to write a plurality of patterns can be reduced to one. The same considerations apply for other layers as well. FIG. 8 illustrates the method for via and wire layers.

Figure 9:
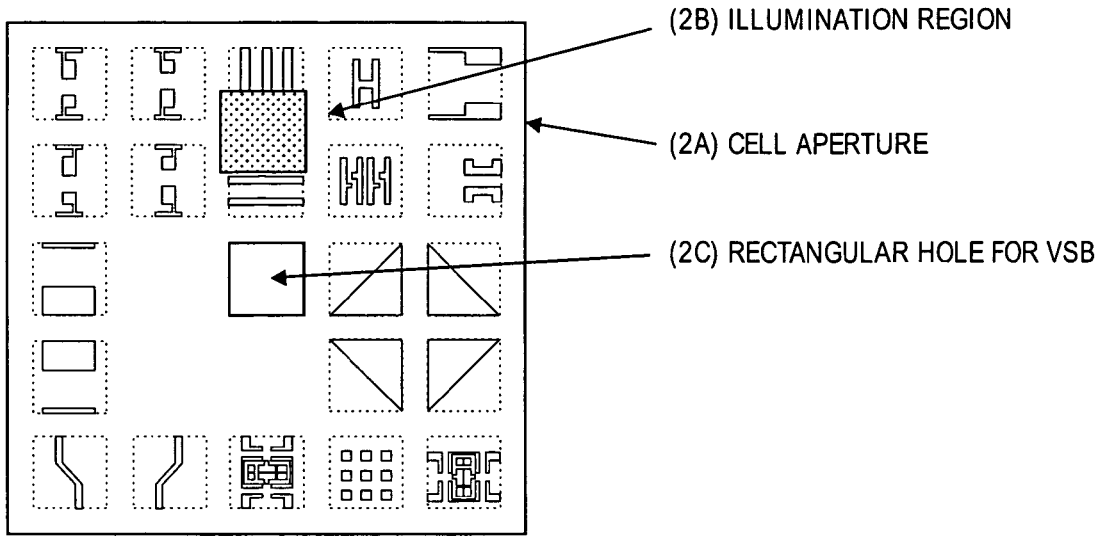

However, to expose a part of a CP cell, there should be a blank region around the cell that blocks the rest of the beam. If another CP cell appears in this region, a part of it will be exposed, as illustrated on FIG. 9. In this case, as depicted in (2b) illumination region of FIG. 9, two CP cells are illuminated by the beam. Therefore, in one approach for implementing partial CP exposure, the cells are less densely packed than those could be without using partial CP exposure.

Figure 10:
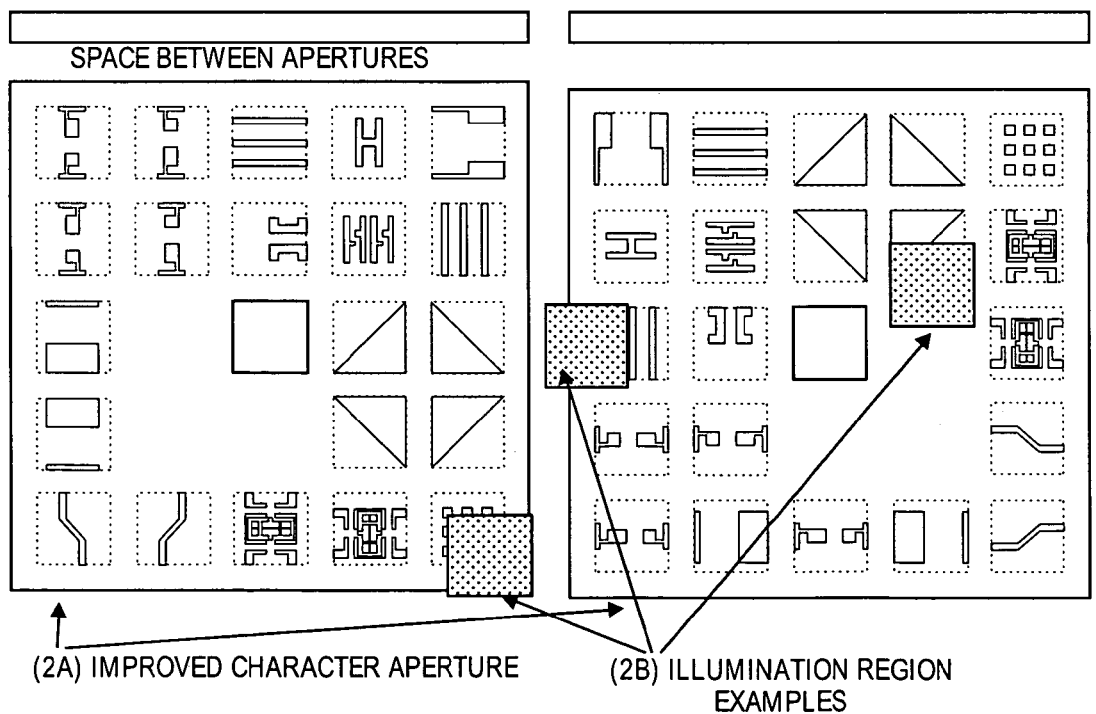

To overcome this disadvantage, one approach is to use the cells that are surrounded by the blank region that is used for VSB exposure. However the conventional method that uses the blank region consumes expensive stencil area. By this invention the periphery of the stencil (indicated as space between apertures in FIG. 10) is used for the blank region and saves waste of the stencil area. As beam distortion is higher on the periphery, the periphery cells can be used as partial CP cells for non-critical parts of the layout, while those cells that are surrounded by the blank area in the center of the stencil can be used as partial CP cells for critical parts of the layout.

The position of such cells is defined during the step 4 (308), taking the design intent into account.

Example 7

To process data more effectively and faster and simultaneously provide good writing quality, in some approaches a configuration is established in which critical and non-critical patterns are not combined on one CP cell.

Illustrative Examples for Step 4 (308)

A method of achieving the goal of step 4 (308) according to some embodiments will be described and illustrated by considering the following examples.

Example 1

One can force certain CP cells to be placed on a stencil by assigning to such a category corresponding processing rules.

Example 2

By assigning pertinent processing rules, CP cells that contain certain shape categories may be given higher (or lower) priority of placing on the stencil.

Example 3

Figure 11:
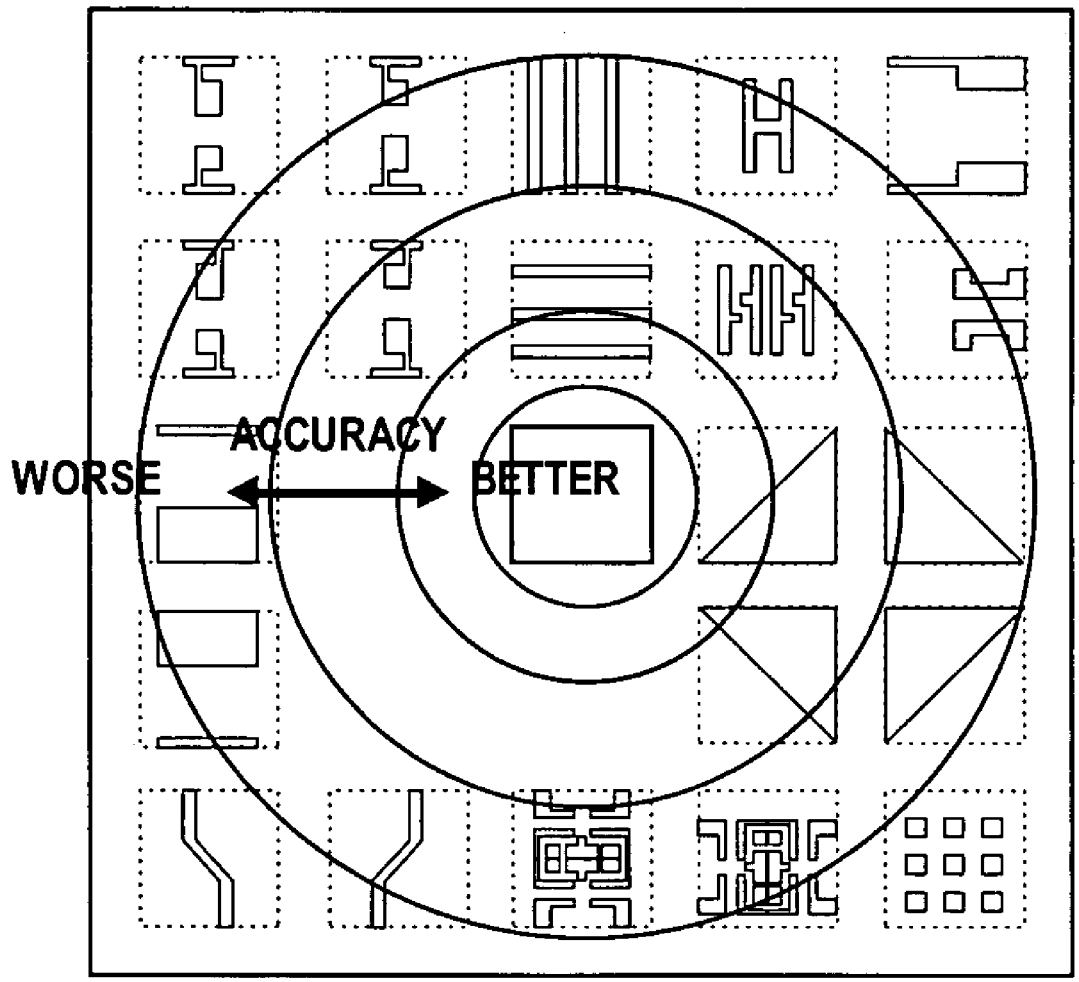

CP cells placed on different positions of a stencil are written with different accuracy. An accuracy map can be prepared that represents writing accuracy with respect to position on a stencil. For example, images of CP cells located closer to the optical axis of a writing machine are usually less distorted (are written with higher accuracy) than those located closer to the periphery. In this case, one can build an accuracy map as illustrated on FIG. 11. CP cells with the design intent that assumes higher quality can be placed in high accuracy regions. It can be easily done by assigning the corresponding processing rules to the corresponding intent categories.

Illustrative Examples for Step 5 (310)

A method of achieving the goal of step 5 (310) according to some embodiments will be described and illustrated by considering the following example:

Example

Assume that a shape with critical size is to be written using VSB method. To minimize Coulomb effect, the part of the shape adjacent to its boundary has to be fractured separately, and exposure dose for each shape thus obtained has to be accurately calculated to minimize proximity effects caused by the features lying in the shape's proximity region. Even during the shot number estimation, it is necessary to take such fine fracturing into account to obtain an accurate shot number estimate. This can be achieved by putting the shape into a pertinent intent category, and by assigning to this category the corresponding fracturing rules. The systems takes these rules into account when estimating the number of shots for that shape.

Alternative Embodiments

Most modern writing systems perform certain data processing operations (certain corrections etc) internally, just before actual writing of a feature, to increase writing quality and avoid unnecessary data volume growth. Such operations, however, are done uniformly, as the system receives only geometric information. In many cases, this leads either to unnecessary enhancements and longer writing time, or to shorter writing time but lower overall quality.

The design intent information provided to the writing system along with geometric data in a simple form suitable for fast real-time processing will help to balance the speed and quality optimally. In this case the additional work will be done only where necessary and to necessary extent.

Although the proposed method is described in terms of processes pertinent to IC fabrication, namely, Electron Beam Direct Writing and Electron Beam Mask Writing, the same approach can be used in any other process of transferring images by means of controllable beam projection equipment that uses VSB and CP techniques.

The same approach of separating the design into intent categories and introducing category specific processing rules can be applied also to a mask data preparation, or any other data preparation system to perform more optimal operations at less time.

As noted above, a great advantage of the present approach is that it takes design intent into consideration. In the conventional systems, design intent is neither provided nor used. The present invention provides a unified way to treat design intent for any type of design. As the result, a single system capable of the optimal stencil design can be built. Not only throughput but other requirements such as quality may be taken into account for any design using the described method.

The proposed method is also highly practical. It can be easily implemented as CAD system or its part, and can be used in combination with the existing systems to enhance capabilities of those.

The partial exposure method extends the number of CP patterns beyond the number of patterns that can be placed on a stencil. This overcomes other approaches in which enough blank space must be provided around a partial CP cell to make partial exposure possible, which decreases the total number of CP cells on the stencil. Embodiments of the present invention describes a way to overcome the problem, since certain CP cells can be used for partial exposure without decrease of the total number of CP cells.

SYSTEM ARCHITECTURES OVERVIEW

Figure 12:
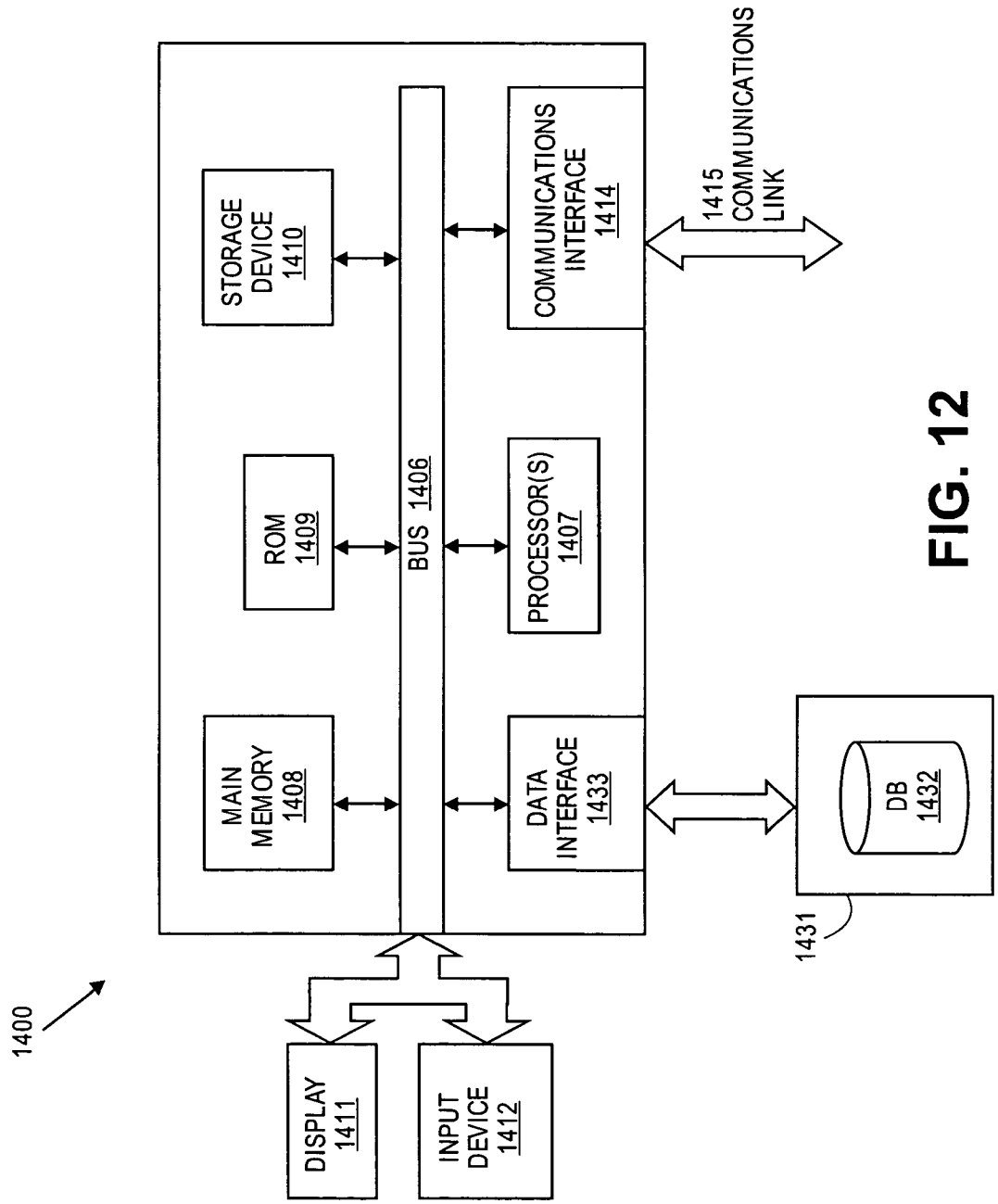
FIG. 12 depicts a computerized system on which a method for electron beam writing can be implemented.

FIG. 12 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable Medium" as used herein refers to any medium that participates in providing instructions to processor 1407 for execution. Such a medium may take many forms, including but not limited to, non-volatile media and volatile media; Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1406 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

What is claimed is:

1. A computer implemented method of electron beam writing, comprising:
    using a computer system which comprises at least one processor and is programmed for:
    receiving stencil design data of a design;
    receiving design intent data;
    receiving equipment capability data;
    combining the stencil data, the design intent data and the equipment capability data;
    determining an optimal electron beam writing pattern based on the combined stencil data, the design intent data and the equipment capability data, wherein the act of determining the optimal electron beam writing pattern comprises applying a partial exposure process to a part of an illumination region in the optimal electron beam writing pattern without negatively affecting a total density of character projection cells in the optimal electron beam writing pattern; and
    causing an electron beam of an electron beam writing apparatus to write on a substrate in accordance with the optimal electron beam writing pattern.

2. The method of claim 1, further comprising considering throughput along with other requirements including quality.

3. The method of claim 1, wherein the method of electron beam writing includes a partial exposure method.

4. The method of claim 3, wherein the partial exposure method extends a number of cell projection patterns beyond a number of patterns that are placed on a stencil.

5. The method of claim 3, wherein at least one of cell projection patterns is used for partial exposure without using more area to accommodate the total number of cell projection patterns or decreasing a total number of the cell projection patterns in a fixed area of the optimal electron beam writing pattern by using periphery in the stencil for blocking unnecessary part of the electron beam, and the periphery represents a blank area between two adjacent cell projection candidates in the stencil.

6. The method of claim 1, further comprising categorizing a design of cell projection patterns by abstract intent categories and using one or more processing rules for each category for designing a throughput and quality balanced stencil.

7. A computer implemented method for generating a stencil table for electron beam writing, the method comprising:
    using a computer system which comprises at least one processor and is programmed for;
    accessing input data or information;
    statistically analyzing a cell layout pattern by calculating a number of repetitions of at least one cell of the cell layout pattern;
    building cell projection candidates by using a result of the act of statistically analyzing the cell layout pattern, wherein the act of building cell projection candidates is performed by a processor;
    placing the cell projection candidates on a stencil, wherein the cell projection candidates are placed in the stencil in which a partial exposure process is applied to a part of a first cell projection candidate of the cell projection candidates without negatively affecting a total density of character projection cells in the stencil;
    estimating throughput of the cell projection candidates;
    displaying a result of the act of building cell projection candidates on a display apparatus or storing the result in a computer readable storage medium or a storage device; and
    generating the stencil table to store a result of the act of placing the cell projection candidates.

8. The method of claim 7, wherein accessing input data or information includes accessing at least one of design intent data, stencil data and equipment capability data.

9. The method of claim 7, wherein accessing the input data or information includes at least one of assigning criticality levels to various portions of the design and defining geometric tolerances to classes of geometric shapes.

10. The method of claim 7, wherein statistically analyzing a cell layout pattern includes determining the number of electron beam shots required to write the cell layout pattern.

11. The method of claim 7, wherein building cell projection candidates includes conforming repetitive portions of the cell layout pattern to one or more stencil design rules.

12. The method of claim 11, wherein the one or more stencil design rules include at least one of maximal size of cell, absence of forbidden patterns including donut shapes and cantilevers, shape density and shape size constraints.

13. The method of claim 11, wherein conforming repetitive portions of the cell layout pattern to one or more stencil design rules includes modifying the cell layout pattern to conform to the one or more stencil rules.

14. The method of claim 7, wherein estimating throughput of the cell projection candidates includes comparing the calculated estimate against one or more corresponding targets.

15. The method of claim 7, wherein estimating throughput of the cell projection candidates includes determining whether one or more predefined rules or conditions are satisfied.

16. The method of claim 7, wherein generating the stencil table includes taping out the stencil data.

17. A stencil design system for electron beam writing, the system comprising:
- a computer system which comprises at least one processor and is programmed for;
- receiving design intent data and stencil design rules from at least one database, wherein the at least one database is stored on a computer readable storage medium or a storage device;
- generating a cell table for the electron beam writer;
- combining the stencil rules and the design intent data;
- determining an optimal electron beam writing pattern based on the combined stencil data, the design intent data and the equipment capability data, wherein
  - the act of determining the optimal electron beam writing pattern comprises applying a partial exposure process to a part of an illumination region in the optimal electron beam writing pattern without negatively affecting a total density of character projection cells in the optimal electron beam writing pattern;
- causing an electron beam of an electron beam writing apparatus to write on a substrate in accordance with the optimal electron beam writing pattern.

18. The system of claim 17, wherein the design intent data includes one or more cell layout patterns and the processor statistically analyzes each cell layout pattern by calculating a number of repetitions of at least one cell of each cell layout pattern.

19. The system of claim 18, wherein the processor builds cell projection candidates by analyzing statistical information of the repetitive portions of the cell layout pattern.

20. The system of claim 19, wherein the processor places the cell projection candidates on a stencil.

21. The system of claim 20, wherein the processor estimates throughput of the cell projection candidates.

22. The system of claim 17, wherein the cell table comprises a stencil table.

23. A computer program product comprising a tangible computer usable storage medium having a sequence of instructions which, when executed by a processor, causes the processor to execute a process for electron beam writing, the process comprising:
- accessing input data or information;
- statistically analyzing a cell layout pattern by calculating a number of repetitions of at least one cell of the cell layout pattern;
- building cell projection candidates by using a result of the act of statistically analyzing the cell layout pattern, wherein the act of building cell projection candidates is performed by the processor;
- placing the cell projection candidates on a stencil, wherein the cell projection candidates are placed in the stencil in which a partial exposure process is applied to a part of a first cell projection candidate of the cell projection candidates without negatively affecting a total density of character projection cells in the stencil;
- estimate throughput of the cell projection candidates;
- a display apparatus configured for displaying a result of placing the cell projection candidates on the stencil or a computer readable storage medium or a storage device configured for storing the result; and
- generate a stencil table.

24. A computer program product comprising a tangible computer usable storage medium having a sequence of instructions which, when executed by a processor, causes the processor to execute a process for electron beam writing, the process comprising:
- receiving stencil design data of a design;
- receiving design intent data;
- receiving equipment capability data;
- combining the stencil data, the design intent data and the equipment capability data;
- determining an optimal electron beam writing pattern based on the combined stencil data, the design intent data and the equipment capability data, wherein the act of determining the optimal electron beam writing pattern comprises applying a partial exposure process to a part of an illumination region in the optimal electron beam writing pattern without negatively affecting a total density of character projection cells in the optimal electron beam writing pattern; and
- causing an electron beam of an electron beam writing apparatus to write on a substrate in accordance with the optimal electron beam writing pattern.

25. A system for generating a stencil table for electron beam writing, the system comprising:
- a computer system which comprises at least one processor and is programmed for;
- accessing input data or information;
- statistically analyzing a cell layout pattern by calculating a number of repetitions of at least one cell of the cell layout pattern;
- building cell projection candidates by using a result generated by the act of statistically analyzing the cell layout pattern;
- placing the cell projection candidates on a stencil taking a design intent into account, wherein the cell projection candidates are placed in the stencil in which a partial exposure process is applied to a part of a first cell projection candidate of the cell projection candidates without negatively affecting a total density of character projection cells in the stencil;
- estimating throughput of the cell projection candidates;
- displaying a result generated by the act of building cell projection candidates on a display apparatus or storing the result in a computer readable storage medium or a storage device of the computer system; and
- generating the stencil table to store a result of the act of placing the cell projection candidates.

* * * * *